US011848629B1

(12) United States Patent
Wang et al.

(10) Patent No.: US 11,848,629 B1
(45) Date of Patent: Dec. 19, 2023

(54) METHOD AND APPARATUS FOR ELECTRIC MOTOR CONTROL

(71) Applicant: GM Global Technology Operations LLC, Detroit, MI (US)

(72) Inventors: Yue-Yun Wang, Troy, MI (US); Lei Hao, Troy, MI (US); Ruixing Long, Novi, MI (US); Bojian Cao, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/825,158

(22) Filed: May 26, 2022

(51) Int. Cl.
| | | |
|---|---|---|
| *H02P 6/10* | (2006.01) | |
| *H02P 21/00* | (2016.01) | |
| *H02P 21/08* | (2016.01) | |
| *H02P 25/10* | (2006.01) | |
| *H02P 27/08* | (2006.01) | |
| *H02P 101/45* | (2016.01) | |

(52) U.S. Cl.
CPC .......... *H02P 21/0017* (2013.01); *H02P 21/08* (2013.01); *H02P 25/107* (2013.01); *H02P 27/08* (2013.01); *H02P 2101/45* (2015.01)

(58) Field of Classification Search
CPC .... H02P 21/0017; H02P 21/08; H02P 25/107; H02P 27/08; H02P 2101/45; H02P 6/10
See application file for complete search history.

(56) References Cited

U.S. PATENT DOCUMENTS

| | | | |
|---|---|---|---|
| 9,154,065 B2* | 10/2015 | Yamazaki | ............... H02P 25/03 |
| 9,705,420 B2 | 7/2017 | Quevedo et al. | |
| 2014/0125264 A1* | 5/2014 | Nakamura | ................ H02P 6/10 |
| | | | 318/400.23 |
| 2017/0264227 A1* | 9/2017 | Shigeta | ..................... H02P 6/18 |
| 2021/0036645 A1* | 2/2021 | Yokoyama | ............ H02P 29/024 |

* cited by examiner

*Primary Examiner* — Cortez M Cook
(74) *Attorney, Agent, or Firm* — CANTOR COLBURN LLP

(57) ABSTRACT

A method and apparatus for electric motor control includes a model predictive controller operating in a d-q reference frame to provide d-q reference frame voltage command signals that counteract a magnetic cross coupling within the motor.

20 Claims, 4 Drawing Sheets

METHOD AND APPARATUS FOR ELECTRIC MOTOR CONTROL

INTRODUCTION

Electric vehicles (EV) and hybrid electric vehicles (HEV) (i.e., electrified vehicles) may include an electric propulsion system including one or more electric drive units including an electric traction motor. Popular motor control methodologies include field oriented control and direct torque control. As computing power has increased, so too has interest in model predictive control of motors.

Model predictive control is appreciated for its capability in handling complex multivariable control problems including high performance traction motor controls in applications which require wide operating ranges, frequent torque output adjustments, durations of steady state operation, rapid dynamic response and high efficiency. Familiar orthogonal (direct and quadrature axes) current and voltage domain controls have proven adaptable for use with model predictive techniques employing cost function minimization to successfully track orthogonal currents.

Traction motors generally, and including permanent magnet and induction machines, exhibit magnetic cross coupling between the direct axis and quadrature axis which may negatively impact motor torque tracking performance resulting in attenuated torque responses and torque disturbances in the form of torque overshoot.

The subject disclosure relates to improved model predictive control of motors, particularly regarding improved performance in rejecting magnetic cross coupling effects.

SUMMARY

In one exemplary embodiment, an apparatus for controlling an electric motor may include a power inverter coupled to a poly-phase stator winding of the electric motor, and a motor controller including a model predictive controller operating in a d-q reference frame to provide d-q reference frame voltage command signals ($v_q$, $v_d$) that counteract a magnetic cross coupling within the electric motor, a transformation module receiving the d-q reference frame voltage command signals ($v_q$, $v_d$) and generating stationary reference frame voltage command signals ($v_{abc}$), and a pulse-width generation module controlling the power inverter based on the stationary reference frame voltage command signals ($v_{abc}$).

In addition to one or more of the features described herein, the model predictive controller may include a cost function module outputting cost function voltage signals ($v_q^*$, $v_d^*$), and feedforward adjustments ($v_{qff}$, $v_{dff}$) to the cost function voltage signals ($v_q^*$, $v_d^*$) to provide the d-q reference frame voltage command signals ($v_q$, $v_d$) that counteract the magnetic cross coupling within the electric motor.

In addition to one or more of the features described herein, the model predictive controller may include a cost function module outputting cost function voltage signals ($v_q^*$, $v_d^*$), and feedback adjustments ($v_{qfb}$, $v_{dfb}$) to the cost function voltage signals ($v_q^*$, $v_d^*$) to provide the d-q reference frame voltage command signals ($v_q$, $v_d$) that counteract the magnetic cross coupling within the electric motor.

In addition to one or more of the features described herein, the model predictive controller may include a cost function module outputting the d-q reference frame voltage command signals ($v_q$, $v_d$) internally forced to counteract d-q axis voltage deviations in accordance with predetermined motor voltage references ($v_{dref}$, $v_{qref}$).

In addition to one or more of the features described herein, the feedforward adjustments ($v_{qff}$, $v_{dff}$) to the cost function voltage signals may be provided by feedforward adjustment modules through mathematical calculations.

In addition to one or more of the features described herein, the feedback adjustments ($v_{qfb}$, $v_{dfb}$) to the cost function voltage signals ($v_q^*$, $v_d^*$) may be provided by feedback adjustment modules through mathematical calculations.

In addition to one or more of the features described herein, the feedforward adjustments ($v_{qff}$, $v_{dff}$) to the cost function voltage signals ($v_q^*$, $v_d^*$) may be provided by feedforward adjustment modules through predefined data sets.

In addition to one or more of the features described herein, the feedback adjustments ($v_{qfb}$, $v_{dfb}$) to the cost function voltage signals ($v_q^*$, $v_d^*$) may be provided by feedback adjustment modules through predefined data sets.

In addition to one or more of the features described herein, the predefined data sets may be referenced by one of d-q axis motor current commands ($\hat{i}_q$, $\hat{i}_d$) and d-q axis motor currents ($i_q$, $i_d$).

In addition to one or more of the features described herein, the predefined data sets may be referenced by d-q axis motor currents ($i_q$, $i_d$).

In addition to one or more of the features described herein, the model predictive controller may further include first order filters applied to the feedforward adjustments ($v_{qff}$, $v_{dff}$).

In another exemplary embodiment, a method for controlling an electric motor including a poly-phase stator winding may include operating a model predictive controller in accordance with a cost function in a d-q reference frame of the electric motor to provide d-q reference frame voltage command signals ($v_q$, $v_d$) that counteract a magnetic cross coupling within the electric motor, transforming the d-q reference frame voltage command signals ($v_q$, $v_d$) into stationary reference frame voltage command signals ($v_{abc}$), and controlling a power inverter coupled to the poly-phase stator winding of the electric motor based on the stationary reference frame voltage command signals ($v_{abc}$).

In addition to one or more of the features described herein, controlling a power inverter coupled to the poly-phase stator winding of the electric motor based on the stationary reference frame voltage command signals ($v_{abc}$) may include providing a pulse-width generation module with the stationary reference frame voltage command signals ($v_{abc}$), generating switching vector signals ($S_{abc}$) based on the stationary reference frame voltage command signals ($v_{abc}$), and controlling the power inverter coupled to the poly-phase stator winding of the electric motor based on the switching vector signals ($S_{abc}$).

In addition to one or more of the features described herein, operating the model predictive controller in accordance with the cost function in the d-q reference frame of the electric motor to provide the d-q reference frame voltage command signals ($v_q$, $v_d$) that counteract the magnetic cross coupling within the electric motor may include outputting cost function voltage signals ($v_q^*$, $v_d^*$), and adjusting the cost function voltage signals ($v_q^*$, $v_d^*$) with feedforward adjustments ($v_{qff}$, $v_{dff}$) to provide the d-q reference frame voltage command signals ($v_q$, $v_d$) that counteract the magnetic cross coupling within the electric motor.

In addition to one or more of the features described herein, operating the model predictive controller in accordance with the cost function in the d-q reference frame of the electric motor to provide the d-q reference frame voltage command signals ($v_q$, $v_d$) that counteract the magnetic cross coupling within the electric motor may include outputting cost function voltage signals ($v_q^*$, $v_d^*$), and adjusting the cost function voltage signals ($v_q^*$, $v_d^*$) with feedback adjustments ($v_{qfb}$, $v_{dfb}$) to provide the d-q reference frame voltage command signals ($v_q$, $v_d$) that counteract the magnetic cross coupling within the electric motor.

In addition to one or more of the features described herein, operating the model predictive controller in accordance with the cost function in the d-q reference frame of the electric motor to provide the d-q reference frame voltage command signals ($v_q$, $v_d$) that counteract the magnetic cross coupling within the electric motor may include forcing the d-q reference frame voltage command signals ($v_q$, $v_d$) internal to the cost function to counteract d-q axis voltage deviations in accordance with predetermined motor voltage references ($v_{dref}$, $v_{qref}$).

In yet another exemplary embodiment, an electrified vehicle may include an electric propulsion system having a rechargeable energy storage system and an electric drive unit, the electric drive unit may include a poly-phase electric motor having a poly-phase stator winding and a traction power inverter module including a motor controller and a power inverter, the power inverter coupled to the poly-phase stator winding. The motor controller may include a model predictive controller operating in a d-q reference frame to provide d-q reference frame voltage command signals ($v_q$, $v_d$) that counteract a magnetic cross coupling within the electric motor, a transformation module receiving the d-q reference frame voltage command signals ($v_q$, $v_d$) and generating stationary reference frame voltage command signals ($v_{abc}$), and a pulse-width generation module controlling the power inverter based on the stationary reference frame voltage command signals ($v_{abc}$).

In addition to one or more of the features described herein, the model predictive controller may include a cost function module outputting cost function voltage signals ($v_q^*$, $v_d^*$), and one of (a) feedforward adjustments ($v_{qff}$, $v_{dff}$) to the cost function voltage signals ($v_q^*$, $v_d^*$) to provide the d-q reference frame voltage command signals ($v_q$, $v_d$) that counteract the magnetic cross coupling within the electric motor and (b) feedback adjustments ($v_{qfb}$, $v_{dfb}$) to the cost function voltage signals ($v_q^*$, $v_d^*$) to provide the d-q reference frame voltage command signals ($v_q$, $v_d$) that counteract the magnetic cross coupling within the electric motor.

In addition to one or more of the features described herein, the model predictive controller may include a cost function module outputting the d-q reference frame voltage command signals ($v_q$, $v_d$) internally forced to counteract d-q axis voltage deviations in accordance with predetermined motor voltage references ($v_{dref}$, $v_{qref}$).

In addition to one or more of the features described herein, the cost function module may include a sum of vector norm squares cost function $$\min_{v_q, v_d} \sum_{i=k}^{k+N} W^T \|T_{qr} - T_q(i)\|^2 + W^y \left\| \begin{pmatrix} \hat{i}_q - i_q(i) \\ \hat{i}_d - i_d(i) \end{pmatrix} \right\|^2 + \sum_{j=k}^{k+M} W^v \left\| \begin{pmatrix} v_{qref} - v_q(j) \\ v_{dref} - v_d(j) \end{pmatrix} \right\|^2$$

wherein
$i_d(i)$, $i_q(i)$ are d-q axis currents,
$\hat{i}_d$, $\hat{i}_q$ are d-q axis current references, $$\left\| \begin{pmatrix} \hat{i}_q - i_q(i) \\ \hat{i}_d - i_d(i) \end{pmatrix} \right\|$$

represents a vector norm for d-q axis motor current error for forcing the d-q motor currents ($i_d(i)$, $i_q(i)$) to the current references ($\hat{i}_d$, $\hat{i}_q$),
$v_d(j)$, $v_q(j)$ are d-q axis motor voltages,
$v_{dref}$, $v_{qref}$ are d-q axis motor voltage references, $$\left\| \begin{pmatrix} v_{qref} - v_q(j) \\ v_{dref} - v_d(j) \end{pmatrix} \right\|$$

represents a vector norm for forcing the motor voltages ($v_d(j)$, $v_q(j)$) to counteract d-q axis voltage deviations and cross coupling effects,
$T_q$ is a motor torque,
$T_{qr}$ is a motor torque reference, $$\|(T_{qr} - T_q(i))\|$$

represents a vector norm for forcing the motor torque ($T_q$) to the motor torque reference ($T_{qr}$), and
$W^T$ $W^y$ and $W^v$ represent respective weights for the vector norm squares.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
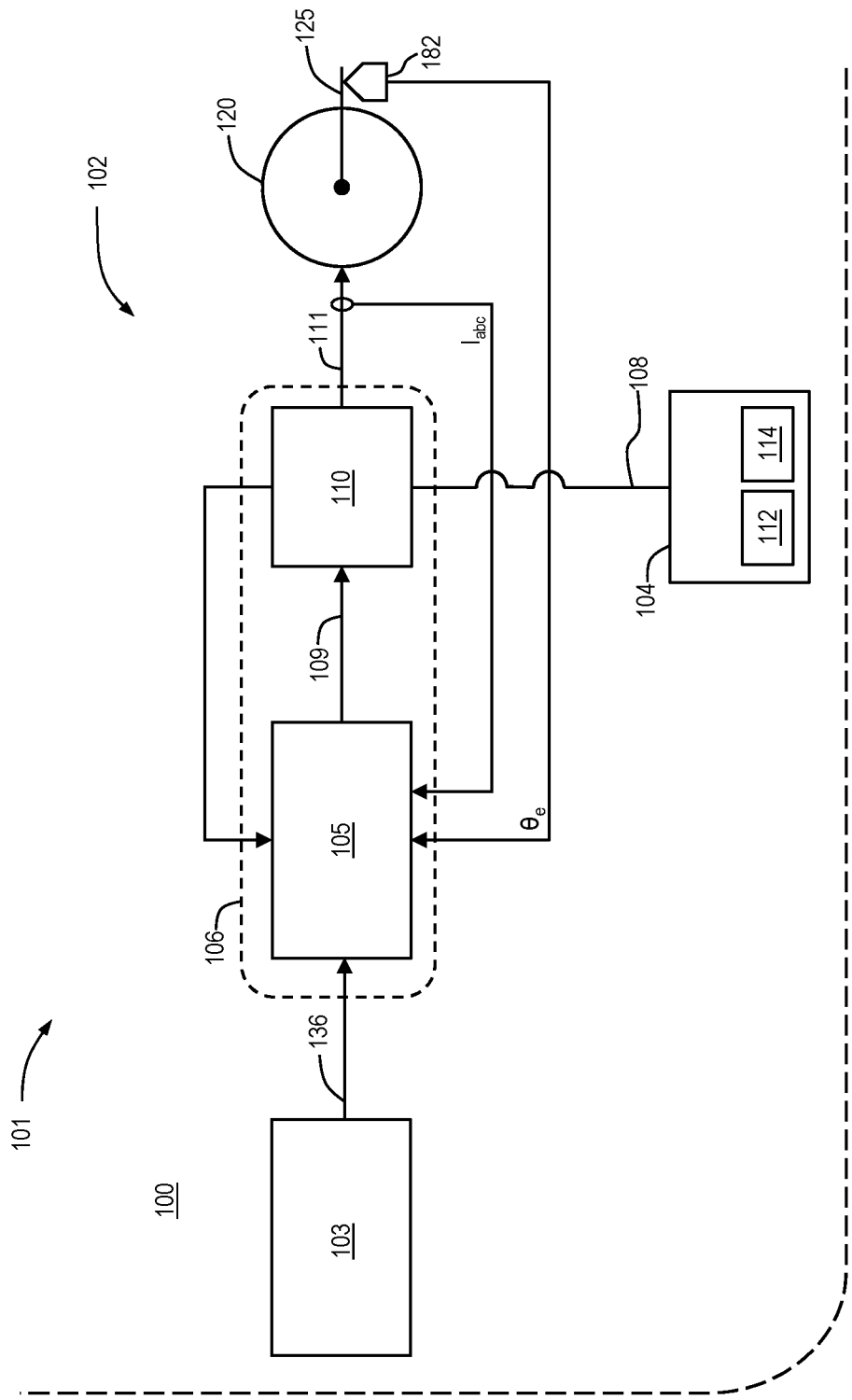
FIG. 1 schematically illustrates an embodiment of an electric propulsion system in a vehicular application, in accordance with the present disclosure.

The following description is merely exemplary in nature and is not intended to limit the present disclosure, its application or uses. Throughout the drawings, corresponding reference numerals indicate like or corresponding parts and features.

FIG. 1 schematically illustrates an embodiment of an electric propulsion system 101 on a vehicle 100. Vehicle and vehicular are understood to refer to any means of transportation including non-limiting examples of motorcycles, cars, trucks, buses, excavation, earth moving, construction and farming equipment, railed vehicles like trains and trams, and watercraft like ships and boats. The electric propulsion system 101 may include various control components, electrical systems and electro-mechanical systems including, for example, a rechargeable energy storage system (RESS) 104 and an electric drive unit (EDU) 102. The electric propulsion system 101 may be employed on a powertrain system to generate propulsion torque as a replacement for, or in conjunction with, an internal combustion engine in various electric vehicle (EV) applications and hybrid electric vehicle (HEV) applications, respectively.

The EDU 102 may be of varying complexity, componentry and integration. An exemplary highly integrated EDU 102 may include, for example, an alternating current (AC) motor (motor) 120 and a traction power inverter module (TPIM) 106 including a motor controller 105 and a power inverter 110. The motor 120 may include a motor output shaft 125 and sensors 182, for example to detect rotor/output shaft position and torque. The motor output shaft 125 may transfer torque between the motor 120 and driveline components (not illustrated), for example a final drive which may include reduction and differential gear sets and one or more axle outputs. The final drive may simply include reduction gearing and a prop shaft output coupling to a differential gear set. One or more axles may couple to the final drive or differential gear sets if separate therefrom. Axle(s) may couple to a vehicle wheel(s) for transferring tractive force between a wheel and pavement. One having ordinary skill in the art will recognize alternative arrangements for driveline components. Propulsion torque requests or commands 136 ($T_{cmd}$) may be provided by a vehicle controller 103 to the motor controller 105.

The motor controller 105 may include one or more control modules. As used herein, control module, module, control, controller, control unit, electronic control unit, processor and similar terms mean any one or various combinations of one or more of Application Specific Integrated Circuit(s) (ASIC), electronic circuit(s), central processing unit(s) (preferably microprocessor(s)) and associated memory and storage (read only memory (ROM), random access memory (RAM), electrically programmable read only memory (EPROM), hard drive, etc.) or microcontrollers executing one or more software or firmware programs or routines, combinational logic circuit(s), input/output circuitry and devices (I/O) and appropriate signal conditioning and buffer circuitry, high speed clock, analog to digital (A/D) and digital to analog (D/A) circuitry and other components to provide the described functionality. A control module may include a variety of communication interfaces including point-to-point or discrete lines and wired or wireless interfaces to networks including wide and local area networks, and in-plant and service-related networks. Functions of a control module as set forth in this disclosure may be performed in a distributed control architecture among several networked control modules. Software, firmware, programs, instructions, routines, code, algorithms and similar terms mean any controller executable instruction sets including calibrations, data structures, and look-up tables. A control module may have a set of control routines executed to provide described functions. Routines are executed, such as by a central processing unit, and are operable to monitor inputs from sensing devices and other networked control modules and execute control and diagnostic routines to control operation of actuators. Routines may be executed at regular intervals during ongoing engine and vehicle operation. Alternatively, routines may be executed in response to occurrence of an event, software calls, or on demand via user interface inputs or requests.

The RESS 104 may, in one embodiment, include an electro-chemical battery pack 112, for example a high capacity, high voltage (HV) rechargeable lithium ion battery pack for providing power to the vehicle via a HV direct current (DC) bus 108. The RESS 104 may also include a battery manager module 114. High capacity battery packs may include a plurality of battery pack modules allowing for flexibility in configurations and adaptation to application requirements. For example, in vehicular uses, the battery pack 112 may be modular to the extent that the number of battery pack modules may be varied to accommodate a desired energy density or range objective of a particular vehicle platform, intended use, or cost target. Thus, battery packs may include a plurality of lithium ion modules themselves constructed from respective pluralities of lithium ion cells.

The motor 120 may be a poly-phase AC motor receiving poly-phase AC power over a poly-phase motor control power bus (AC bus) 111 which is coupled to the power inverter 110. In one embodiment, the motor 120 is a three-phase motor and the power inverter 110 is a three-phase inverter. The power inverter 110 may include a plurality of solid-state switches such as IGBTs and power MOSFETs. The power inverter 110 couples to DC power over the HV DC bus 108 (DC input voltage ($V_{dc}$)) from the RESS 104, for example at 400 volts. The motor controller 105 is coupled to the power inverter 110 for control thereof. The power inverter 110 electrically connects to stator phase windings of a three-phase stator winding of the motor 120 via the AC bus 111, with electric current monitored on two or three of the phase leads thereof. The power inverter 110 may be configured with suitable control circuits including paired power transistors (e.g., IGBTs) for transforming high-voltage DC voltage on the HV DC bus 108 to high-voltage three-phase AC voltage ($v_{abc}$) on the AC bus 111 and transforming high-voltage three-phase AC voltage ($v_{abc}$) on the AC bus 111 to high-voltage DC voltage on the HV DC bus 108. The power inverter 110 may employ any suitable pulse width modulation (PWM) control, for example sinusoidal pulse width modulation (SPWM) or space vector pulse width modulation (SVPWM), to generate switching vector signals ($S_{abc}$) 109 to convert stored DC electric power originating in the battery pack 112 of the RESS 104 to AC electric power to drive the motor 120 to generate torque. Similarly, the inverter 110 may convert mechanical power transferred to the motor 120 to DC electric power to generate electric energy that is storable in the battery pack 112 of the RESS 104, including as part of a regenerative braking control strategy. The power inverter 110 may be configured to receive the switching vector signals ($S_{abc}$) 109 from motor controller 105 and control inverter states to provide the motor drive and regeneration functionality.

Control of the power inverter 110 may include high frequency switching of the solid-state switches in accordance with the PWM control. A number of design and application considerations and limitations determine inverter switching frequency and PWM control. Inverter controls for AC motor applications may include fixed switching frequencies, for example switching frequencies around 10-12 kHz and PWM controls that minimize switching losses of the IGBTs or other power switches of the power inverter 110.

Figure 2:
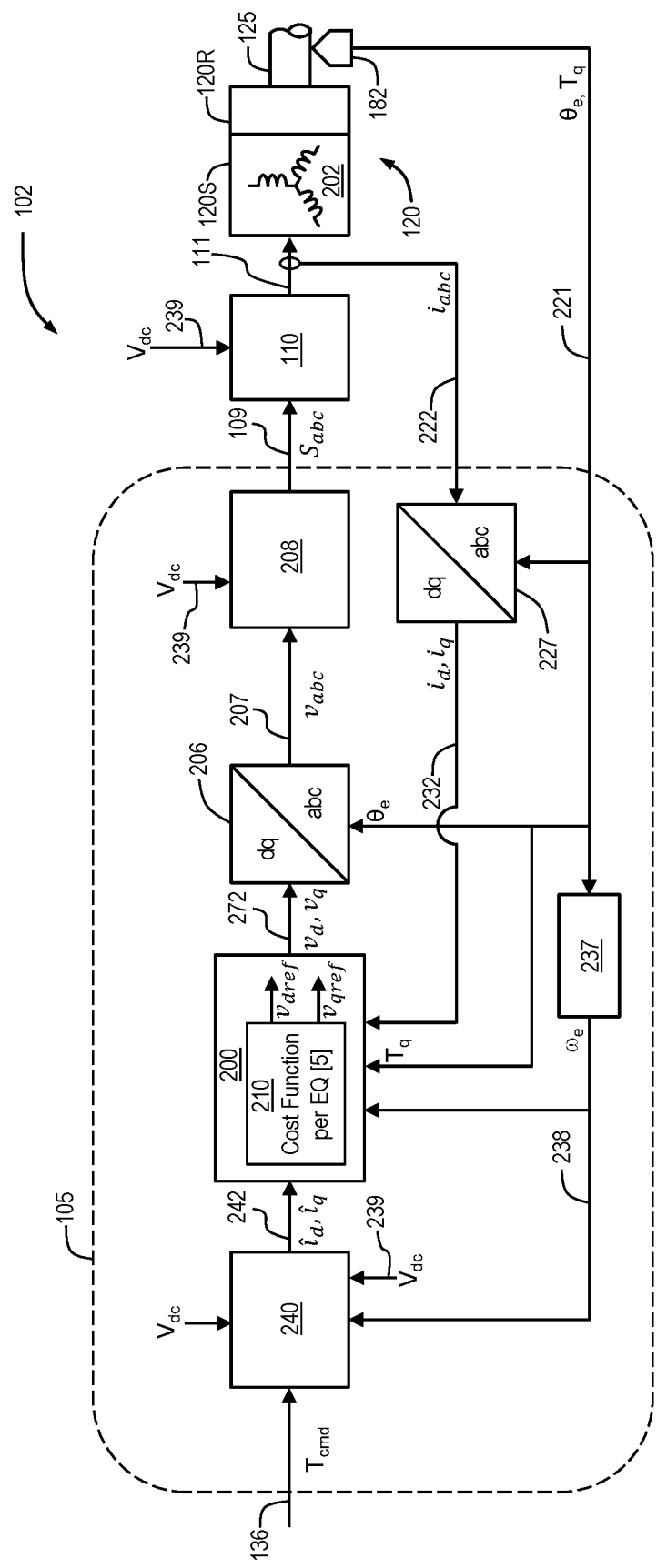
FIG. 2 is a block diagram of a motor controller and electric drive unit employing an exemplary model predictive controller, in accordance with the present disclosure.

FIG. 2 is a block diagram illustrating the motor controller 105 and EDU 102. The motor controller 105 in one embodiment may employ a model predictive controller (MPC) 200. The EDU 102 may include the motor 120, including a stator 120S and a rotor 120R, and a power inverter 110. The stator 120S includes a three phase winding 202 and the rotor 120R may be coupled to the motor output shaft 125. Using a MPC control scheme, the MPC 200 controls the motor 120 via the power inverter 110 coupled to the three phase winding 202 of the motor 120 so that the AC motor 120 can efficiently use the DC input voltage ($V_{dc}$) provided to the power inverter 110 by controlling d-q axis voltage command signals 272 ($v_q$, $v_d$).

In one embodiment, the motor 120 may be a three-phase, interior permanent magnet (IPM) AC machine. However, it is appreciated that the illustrated embodiment is only one non-limiting example of the types of three-phase AC machines that the disclosed embodiments may be applied to. For example, induction machines may be used. Further, it will also be appreciated that the disclosed embodiments are not limited to a three-phase system and, in other embodiments, the motor 120 may have other numbers of phases. It is appreciated that the disclosed embodiments may be applied to any type of multi-phase AC machine that includes fewer or more phases.

The motor 120 is coupled to the power inverter 110 via three inverter poles and generates mechanical power as the product of torque and speed based on the three-phase stationary reference frame stator currents 222 ($i_{abc}$) of the power inverter 110. In the present embodiment, the angular position 221 ($\theta_e$) of the rotor 120R is measured from one or more sensors 182 such as an encoder. A derivative function, or a virtual software observer, 237 of the angular position 221 ($\theta_e$) of the rotor 120R may be used to generate angular velocity 238 ($\omega_e$) of the rotor 120R.

The motor controller 105 may include a command generation module 240, a rotating orthogonal (d-q) reference frame to static three-phase (abc) reference frame (dq-to-abc reference frame) transformation module 206, a PWM generation module 208, and a static three-phase (abc) reference frame to rotating orthogonal (d-q) reference frame (abc-to-dq reference frame) transformation module 227.

The command generation module 240 receives the torque command 136 ($T_{end}$), angular velocity 238 ($\omega_e$), and the DC input voltage ($V_{dc}$) 239 as inputs, along with other system parameters depending upon implementation. The command generation module 240 uses these inputs to generate d-q axis motor current commands 242 ($\hat{i}_d$, $\hat{i}_q$) that will cause the AC motor 120 to generate the torque command 136 ($T_{cmd}$) at angular velocity 238 ($\omega_e$). In one embodiment, command generation module 240 is implemented in look-up tables.

The abc-to-dq transformation module 227 receives measured three-phase stationary reference frame stator currents 222 ($i_{abc}$) that are fed back from the motor 120. The abc-to-dq transformation module 227 uses these three-phase stationary reference frame stator currents 222 ($i_{abc}$) to perform an abc-to-dq reference frame transformation to transform the three-phase stationary reference frame stator currents 222 ($i_{abc}$) into the d-q axis motor currents 232 ($i_d$, $i_q$) which are fed back to the MPC 200. The process of stationary-to-synchronous conversion is well-known in the art.

The MPC 200 receives the d-q axis motor current commands 242 ($\hat{i}_d$, $\hat{i}_q$), the d-q axis motor currents 232 ($i_d$, $i_q$), motor torque $T_q$ from one or more sensors 182 such as a torque sensor, and the angular velocity ($\omega_e$) to generate d-q axis voltage command signals 272 ($v_q$, $v_d$). The d-q axis voltage command signals 272 ($v_q$, $v_d$) are DC commands that have a constant value as a function of time for steady state operation. The process of current to voltage conversion by the MPC 200 may be implemented through a cost function minimization as further described herein.

The dq-to-abc reference frame transformation module 206 receives the d-q axis voltage command signals 272 ($v_q$, $v_d$) and, based on these signals, generates stationary reference frame voltage command signals 207 ($v_{abc}$) (also referred to as "phase voltage signals" or "phase voltage command signals") that are sent to the PWM generation module 208. The dq-to-abc transformation may be performed using any known transformation techniques.

The power inverter 110 is coupled to the PWM generation module 208. The PWM generation module 208 is used for the control of pulse width modulation of the phase voltage command signals 207 ($v_{abc}$). Switching vector signals 109 ($S_{abc}$) are generated based on duty cycle waveforms that are internally generated by the PWM generation module 208 to have a particular duty cycle during each PWM period. The PWM generation module 208 generates the switching vector signals 109 ($S_{abc}$) based on the phase voltage command signals 207 ($v_{abc}$) and provides the switching vector signals 109 ($S_{abc}$) to the power inverter 110. The particular modulation algorithm implemented in the PWM generation module 208 may be any known modulation algorithm including continuous PWM (e.g., Space Vector Pulse Width Modulation (SVPWM)) or discontinuous PWM (e.g., DPWM) to create AC waveforms that drive the AC motor 120 at varying angular velocities based on the DC input voltage 239 ($V_{dc}$). It is generally appreciated that discontinuous PWM has lower switching losses and hence less heat generation than continuous PWM. Moreover, the switching frequency implemented in the PWM generation module 208 may be fixed or variable in accordance with various control objectives and efficiency tradeoffs.

The switching vector signals 109 ($S_{abc}$) control the switching states of switches in the power inverter 110 to generate the respective phase voltages at each phase winding of the motor 120. The motor 120 receives the three-phase voltage signals generated by the power inverter 110 and generates a machine output consistent with the torque command 136 ($T_{cmd}$).

In accordance with one embodiment, the MPC 200 may include a cost function module 210 to provide an optimal solution, for example, to a cost function such as a sum of vector norm squares as follows.

$$\min_{v_q, v_d} \sum_{i=k}^{k+N} W^y \left\| \begin{pmatrix} \hat{i}_q - i_q(i) \\ \hat{i}_d - i_d(i) \end{pmatrix} \right\|^2 + \sum_{j=k}^{k+M} W^{\Delta v} \left\| \begin{pmatrix} \Delta v_q(j) \\ \Delta v_d(j) \end{pmatrix} \right\|^2 \quad [1]$$

The MPC 200 may determine the d-q axis voltage command signals 272 ($v_q$, $v_d$) in accordance with minimizing the cost function [1] wherein the d-q axis motor currents $i_d$, $i_q$ track the d-q axis motor current commands 242 ($\hat{i}_d$, $\hat{i}_q$). The cost function [1] in the present embodiment is based on minimizing current error relative to current command references. Alternative cost functions may be employed including, for example, a cost function based on torque error. It is appreciated in the cost function [1] of the present embodiment that current references are represented in the d-q axis motor current commands 242 ($\hat{i}_d$, $\hat{i}_q$) provided by the command generation module 240 (e.g., look-up tables). Thus, in the cost function [1]:

$$\left\| \begin{pmatrix} \hat{i}_q - i_q(i) \\ \hat{i}_d - i_d(i) \end{pmatrix} \right\|$$

represents a vector norm for d-q axis motor current error for forcing the d-q axis motor currents ($i_d(i)$, $i_q(i)$) to the d-q axis motor current references ($\hat{i}_d$, $\hat{i}_q$), $$\left\| \begin{pmatrix} \Delta v_q(j) \\ \Delta v_d(j) \end{pmatrix} \right\|$$

represents a vector norm for limiting excessive changes of d-q axis motor voltages ($v_q$, $v_d$), and $W^y$ and $W^{\Delta v}$ represent respective weights for the vector norm squares, which weights may be static, time variable or condition variable.

The MPC 200 is based on an electric dynamic model (model) of, in the present embodiment, an IPM motor. Similar electric dynamic models for other AC electric machines (e.g., induction motors) may also provide the basis for an MPC control of such alternative machines. The model may be represented as follows:

$$L_q \frac{di_q}{dt} = -L_d i_d \omega_e - \lambda_m \omega_e - r_s i_q + v_q \quad [2]$$

$$L_d \frac{di_d}{dt} = L_q i_q \omega_e - r_s i_d + v_d \quad [3]$$

$$T_q = \frac{3}{2} P(\lambda_m i_q - (L_q - L_d) i_q i_d) \quad [4]$$

wherein $i_d$ and $i_q$ represent the d-axis motor current and the q-axis motor current, respectively;

$v_d$ and $v_q$ represent the d-axis motor voltage and the q-axis motor voltage, respectively;

$L_d$ and $L_q$ represent the d-axis motor inductance and the q-axis motor inductance, respectively;

$\lambda_m$ represents the mechanical linkage flux;

$\omega_e$ represents angular velocity of the rotor;

$T_q$ represents the motor torque; and

P represents the number of motor pole pairs.

It is recognized that the model relationships [2] and [3] may be rearranged and represented by equivalent relationships [2a] and [3a] as follows:

$$v_q = L_q \frac{di_q}{dt} + r_s i_q + [L_d i_d \omega_e + \lambda_m \omega_e] \quad [2a]$$

$$v_d = L_d \frac{di_d}{dt} + r_s i_d + [-L_q i_q \omega_e] \quad [3a]$$

It is recognized that the product of the d-axis motor inductance and current ($L_d i_d$) is equivalent to the d-axis motor flux ($\lambda_d$). Similarly, the product of the q-axis motor inductance and current ($L_q i_q$) is equivalent to the q-axis motor flux ($\lambda_q$). Therefore, from the model, magnetic cross coupling in the motor is apparent and proportional to the d-q axis motor currents ($i_d$, $i_q$) and motor speed (i.e., angular velocity ($\omega_e$)). The cross coupling may be understood from the model relationships [2] and [3] wherein $$L_q \frac{di_q}{dt} = f[-L_d i_d \omega_e - \lambda_m \omega_e] \text{ and } L_d \frac{di_d}{dt} = f[L_q i_q \omega_e]$$

and wherein the bracketed terms in the model relationships [2a] and [3a], [$L_d i_d \omega_e + \lambda_m \lambda_e$] and [$-L_q i_q \omega_e$], may be referred to as cross coupling terms. It is appreciated that these cross coupling terms represent d-q axis voltage deviations due to magnetic coupling and may be referred to herein as cross coupled voltage deviations. Often, $\lambda_m \omega_e$ may have a relatively less significant impact than $L_d i_d \omega_e$ and may be ignored or treated as varying proportionally to angular velocity ($\omega_e$) below the field weakening region of the motor. In practice, such cross coupling and resultant cross coupled voltage deviations may undesirably affect the motor torque. Cross coupling as used herein is understood to refer to magnetic cross coupling within the motor whether represented in terms of motor flux $\lambda$ or motor inductance and current (Li).

Figure 3:
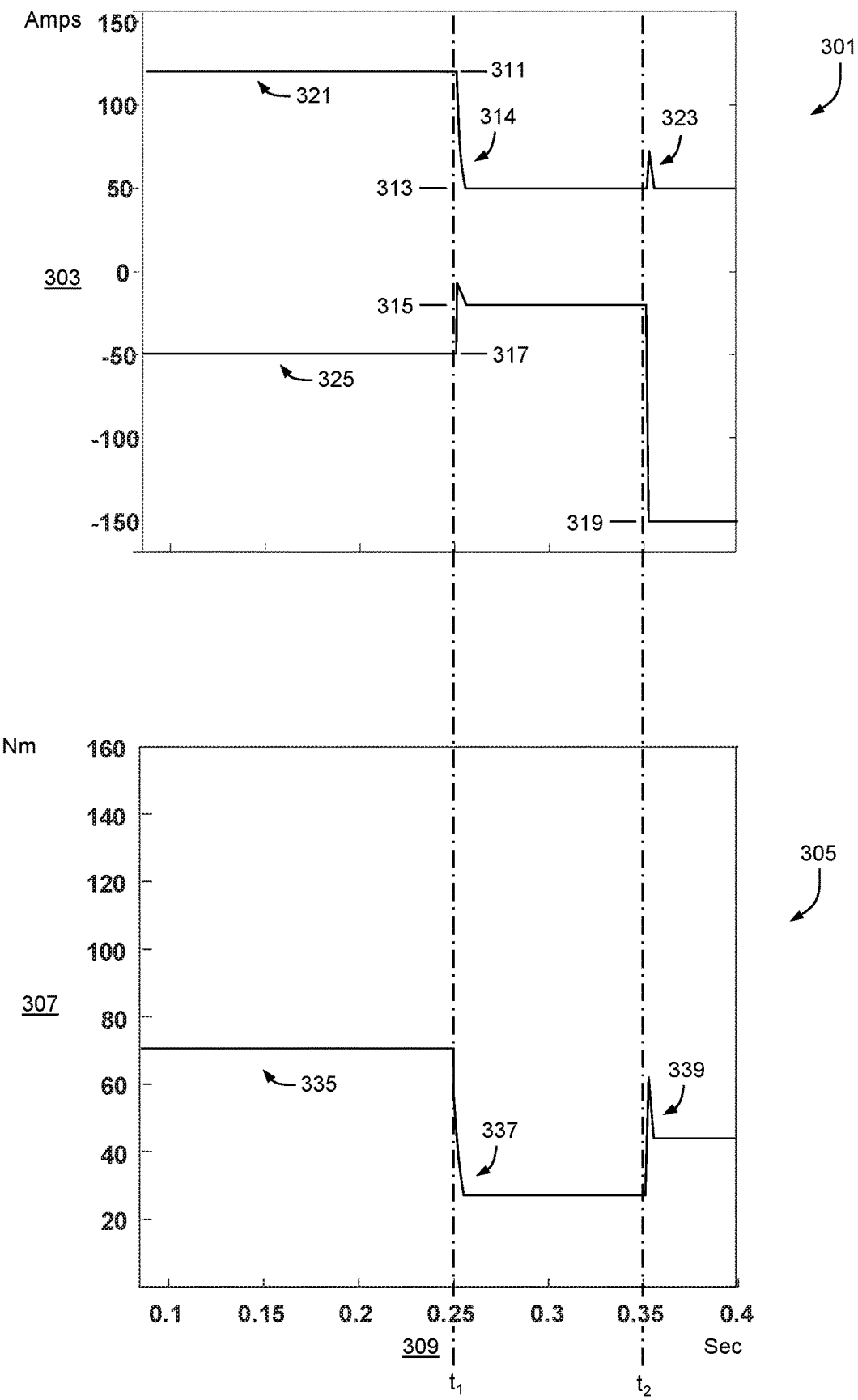
FIG. 3 illustrates motor currents and motor torque responses, in accordance with the present disclosure.

With reference to FIG. 3, the motor torque effects of exemplary direct axis (d-axis) and quadrature axis (q-axis) current changes are illustrated for a motor controlled in accordance with an MPC including a cost function [1] as described herein. The upper chart 301 of FIG. 3 illustrates current in Amperes (Amps) along the vertical axis 303 and plots of d-axis motor current 325 ($i_d$) and q-axis motor current 321 ($i_q$) that follow d-axis current commands (315, 317, 319) and q-axis motor current commands (311, 313). The lower chart 305 of FIG. 3 illustrates corresponding motor torque response in Newton-meters (Nm) along the vertical axis 307. Time is illustrated in seconds (Sec) for both the upper chart 301 and lower chart 305 along a common horizontal time axis 309. FIG. 3 illustrates MPC with unchecked cross coupling effects from the d-q axis motor currents ($i_d$, $i_q$). The MPC prior to time $t_1$ is substantially steady state with the q-axis motor current command 311 ($\hat{i}_q$) and the d-axis motor current command 317 ($\hat{i}_d$). The q-axis motor current 321 ($i_q$) therefore tracks the q-axis motor current command 311 ($\hat{i}_q$), and the d-axis motor current 325 ($i_d$) therefore tracks the d-axis motor current command 317 ($\hat{i}_d$). Motor torque 335 prior to time $t_1$ is also seen to be constant. At time $t_1$, the MPC issues a reduced positive q-axis motor current command 313 ($\hat{i}_q$) and a reduced negative d-axis motor current command 315 ($\hat{i}_d$). The coupling effect of the q-axis motor current 321 ($i_q$) upon the d-axis motor current 325 ($i_d$) may be seen in the transient overshoot 315 of the d-axis motor current 325 ($i_d$) and may reduce the slew rate of the motor torque at 337 since the d-axis is the axis by which rotor flux is produced. At time $t_2$, the MPC maintains the positive q-axis motor current command 313 ($\hat{i}_q$) and commands a larger negative d-axis motor current command 319 ($i_d$). The coupling effect of the d-axis motor current 325 ($i_d$) upon the q-axis motor current 321 ($i_q$) may be seen in the transient overshoot 323 of the q-axis motor current 321 ($i_q$) and may create a transient torque disturbance overshoot of the motor torque at 339 since the q-axis is the axis on which torque is produced. Thus, it is appreciated that the cross coupling of the d-q-axis motor currents ($i_d$, $i_q$) negatively affects the torque tracking performance of MPC. It is further appreciated from the model relationships [2a] and [3a] that the cross coupling of the d-q axis motor currents ($i_d$, $i_q$) may manifest in the d-q-axis motor voltages ($v_q$, $v_d$) as cross coupled voltage deviations.

Figure 4:
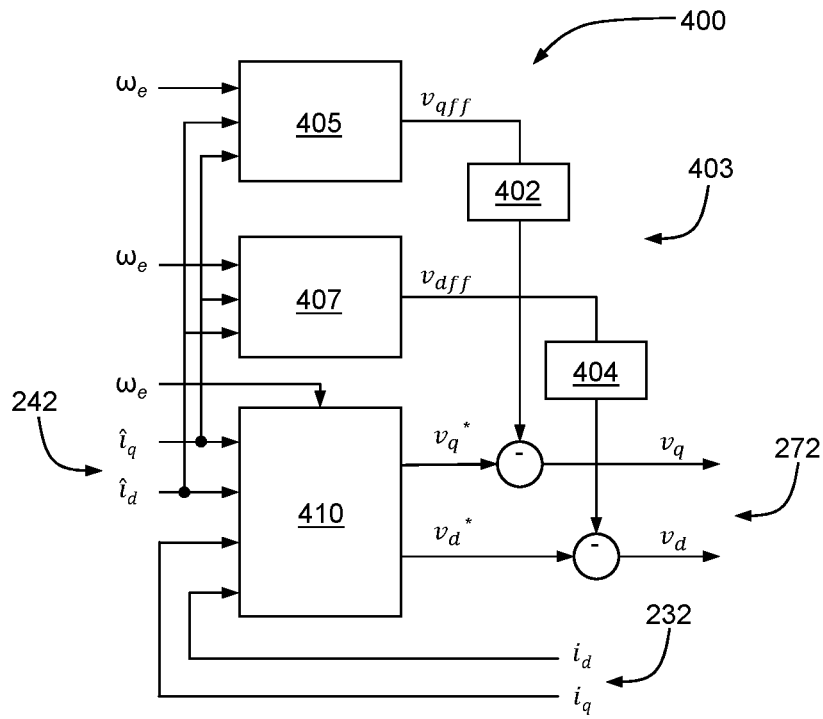
FIG. 4 illustrates an embodiment of a model predictive controller with motor voltage feedforward adjustments, in accordance with the present disclosure.

In accordance with the present disclosure, an improved MPC may include addressing the magnetic cross coupling to improve the torque tracking of the motor. Advantageously, cross coupling may be addressed in the motor voltage domain, and specifically in the d-q-axis motor voltages. With reference to FIG. 4, in accordance with one embodiment, an improved MPC 400 may employ feedforward adjustments 403 to the cost function d-q-axis voltage signals ($v_q^*$, $v_d^*$) output from the cost function module 410 to counteract the cross coupling. The cost function module 410 in one embodiment may employ a cost function such as a sum of vector norm squares shown in cost function [1] herein. The feedforward adjustments 403 may be provided by respective feedforward adjustment modules 405 and 407. The feedforward adjustments 403 may be represented in a d-axis feedforward adjustment ($v_{dff}$) and a q-axis feedforward adjustment ($v_{qff}$). In practice, the d-axis feedforward adjustment ($v_{dff}$) corresponds to the cross coupling term [$-L_q i_q \omega_e$] affecting the d-axis motor voltage ($v_d$) and a q-axis feedforward adjustment ($v_{qff}$) corresponds to the cross coupling term [$L_d i_d \omega_e + \lambda_m \omega_e$] affecting the q-axis motor voltage ($v_q$). It is known that the d-axis motor inductance ($L_d$) and the q-axis motor inductance ($L_q$) both vary non-linearly as functions of both the d-axis motor current ($i_d$) and the q-axis motor current ($i_q$). In one implementation, the feedforward adjustment modules 405 and 407 may provide the d-axis feedforward adjustment ($v_{dff}$) and the q-axis feedforward adjustment ($v_{qff}$) calculations from predefined multivariable nonlinear equations based on known simulation and empirical derivations, regressions, curve fitting, linear and nonlinear piecewise functions or approximations and other mathematically based calculation techniques. Alternatively, the feedforward adjustment modules 405 and 407 may provide predefined data sets in the form of look-up tables to be referenced to return the d-axis feedforward adjustment ($v_{dff}$) and the q-axis feedforward adjustment ($v_{qff}$). A minimum set of input variables used in the determination of d-axis feedforward adjustment ($v_{dff}$) and the q-axis feedforward adjustment ($v_{qff}$) may include the q-axis motor current command ($\hat{i}_q$) the d-axis motor current command ($\hat{i}_d$) and angular velocity ($\omega_e$) as shown in FIG. 4. Additional input variables, such as motor temperature, also may be employed. Alternatively, the q-axis motor current ($i_q$) and the d-axis motor current ($i_d$) may be utilized in place of the q-axis motor current command ($\hat{i}_q$), the d-axis motor current command ($\hat{i}_d$). As shown in FIG. 4, the d-axis feedforward adjustment ($v_{dff}$) and the q-axis feedforward adjustment ($v_{qff}$) may be subjected to filters 402 and 404 respectively, which filters may, for example, provide first order tuning in the application of the feedforward adjustments.

Figure 5:
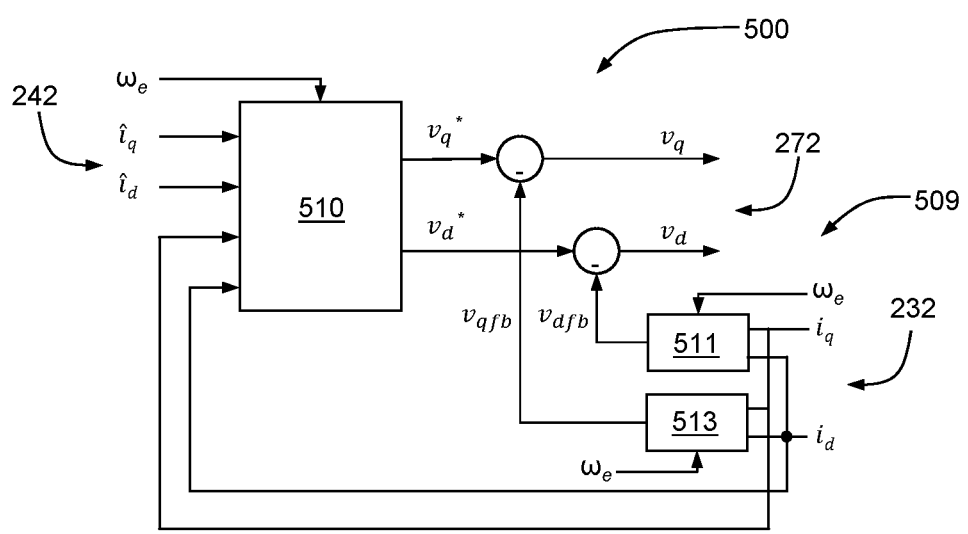
FIG. 5 illustrates an embodiment of a model predictive controller with motor voltage feedback adjustments, in accordance with the present disclosure.

With reference to FIG. 5, in accordance with another embodiment, an improved MPC 500 may employ feedback adjustments 509 to the cost function d-q-axis voltage signals ($v_q^*$, $v_d^*$) output from the cost function module 510 to counteract the cross coupling. The cost function module 510 in one embodiment may employ a cost function such as a sum of vector norm squares shown in cost function [1] herein. The feedback adjustments 509 may be provided by respective feedback adjustment modules 511 and 513. The feedback adjustments 509 may be represented in a d-axis feedback adjustment ($v_{dfb}$) and a q-axis feedback adjustment ($v_{qfb}$). In practice, the d-axis feedback adjustment ($v_{dfb}$) corresponds to the cross coupling term [$-L_q i_q \omega_e$] affecting the d-axis motor voltage ($v_d$) and a q-axis feedback adjustment ($v_{qfb}$) corresponds to the cross coupling term [$L_d i_d \omega_e + \lambda_m \omega_e$] affecting the q-axis motor voltage ($v_q$). It is known that the d-axis motor inductance ($L_d$) and the q-axis motor inductance ($L_q$) both vary nonlinearly as functions of both the d-axis motor current ($i_d$) and the q-axis motor current ($i_q$). In one implementation, the feedback adjustment modules 511 and 513 may provide the d-axis feedback adjustment ($v_{dfb}$) and the q-axis feedback adjustment ($v_{qfb}$) calculations from predefined multivariable nonlinear equations based on known simulation and empirical derivations, regressions, curve fitting, linear and nonlinear piecewise functions or approximations and other mathematically based calculation techniques. Alternatively, the feedback adjustment modules 511 and 513 may provide predefined data sets in the form of look-up tables to be referenced to return the d-axis feedback adjustment ($v_{dfb}$) and the q-axis feedback adjustment ($v_{qfb}$). A minimum set of input variables used in the determination of d-axis feedback adjustment ($v_{dfb}$) and the q-axis feedback adjustment ($v_{qfb}$) may include the q-axis motor current ($i_q$) and the d-axis motor current ($i_d$) and angular velocity ($\omega_e$) as shown in FIG. 5. Additional input variables, such as motor temperature, also may be employed.

In accordance with another embodiment, an improved MPC may employ a cost function module internally accounting for cross coupled voltage deviations for forcing the motor voltages ($v_d(j)$, $V_q(j)$) to counteract the cross coupled voltage deviations thereby counteracting the cross coupling without the need for feedforward adjustments or feedback adjustments to the d-q axis voltage command signals ($v_q$, $v_d$) output from the cost function module 210. Thus, in accordance with this embodiment, the MPC 200 may include a cost function module 210 to provide an optimal solution, for example, to a cost function such as a sum of vector norm squares as follows.

$$\min_{v_q, v_d} \sum_{i=k}^{k+N} W^T \|T_{qr} - T_q(i)\|^2 + \qquad [5]$$

$$W^y \left\| \begin{pmatrix} \hat{i}_q - i_q(i) \\ \hat{i}_d - i_d(i) \end{pmatrix} \right\|^2 + \sum_{j=k}^{k+M} W^v \left\| \begin{pmatrix} v_{qref} - v_q(j) \\ v_{dref} - v_d(j) \end{pmatrix} \right\|^2$$

The MPC 200 may determine the d-q axis voltage command signals 272 ($v_q$, $v_d$) in accordance with minimizing the cost function [5] wherein the d-q axis motor currents $i_d$, $i_q$ track the motor current commands 242 ($\hat{i}_d$, $\hat{i}_q$) and the motor voltages ($v_d(j)$, $V_q(j)$) are forced to counteract the cross coupled voltage deviations through the d-q axis motor voltage references ($v_{dref}$, $v_{qref}$) as described further herein. Additionally, the cost function [5] in the present embodiment may further include tracking of the motor torque $T_q$ to the torque command ($T_{cmd}$) as the reference. It is appreciated in the cost function [5] of the present embodiment that current references are represented in the d-q axis motor current commands 242 ($\hat{i}_d$, $\hat{i}_q$) provided by the command generation module 240 (e.g., look-up tables), and the torque reference is represented in the torque command 136 ($T_{cmd}$) provided by the vehicle controller 103. Furthermore, it is appreciated in the cost function [5] of the present embodiment that the d-q axis motor voltage references ($v_{dref}$, $v_{qref}$) may be provided as follows:

$$v_{qref} = [L_d \hat{i}_d \omega_e + \lambda_m \omega_e] \qquad [6]$$

$$v_{dref} = [-L_q \hat{i}_q \omega_e] \qquad [7]$$

wherein the d-q axis motor current commands 242 ($\hat{i}_d$, $\hat{i}_q$) are used in the determination of the d-q axis motor voltage references ($v_{dref}$, $v_{qref}$) It is recognized that the bracketed terms are the cross coupling terms responsible for cross coupled voltage deviations due to magnetic coupling. Thus, in the cost function [5]:

$$\left\| \begin{pmatrix} \hat{i}_q - i_q(i) \\ \hat{i}_d - i_d(i) \end{pmatrix} \right\|$$

represents the vector norm for d-q axis motor current error for forcing the d-q axis motor currents ($i_d(i)$, $i_q(i)$) to the d-q axis current references ($\hat{i}_d$, $\hat{i}_q$), $$\left\|\begin{pmatrix} v_{qref} - v_q(j) \\ v_{dref} - v_d(j) \end{pmatrix}\right\|$$

represents a vector norm for forcing the d-q axis motor voltages ($v_d(j)$, $V_q(j)$) to counteract the cross coupled voltage deviations and undesirable cross coupling effects, $$\|(T_{qr} - T_q(i))\|$$

represents a vector norm for forcing the motor torque ($T_q$) to the torque command ($T_{cmd}$), and $W^T w^y$ and $W^v$ represent respective weights for the vector norm squares, which weights may be static, time variable or condition variable.

Thus, it may be appreciated that the d-q axis voltage command signals 272 ($v_q$, $v_d$) output from the MPC 200 in accordance with the cost function [5] of the present embodiment substantially counteract the undesirable magnetic cross coupling effects within the motor.

Unless explicitly described as being "direct," when a relationship between first and second elements is described in the above disclosure, that relationship can be a direct relationship where no other intervening elements are present between the first and second elements but can also be an indirect relationship where one or more intervening elements are present (either spatially or functionally) between the first and second elements.

One or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

While the above disclosure has been described with reference to exemplary embodiments, it will be understood by those skilled in the art that various changes may be made, and equivalents may be substituted for elements thereof without departing from its scope. In addition, many modifications may be made to adapt a particular situation or material to the teachings of the disclosure without departing from the essential scope thereof. Therefore, it is intended that the present disclosure is not limited to the particular embodiments disclosed, but will include all embodiments falling within the scope thereof

What is claimed is:

1. An apparatus for controlling an electric motor, comprising:
a power inverter coupled to a poly-phase stator winding of the electric motor; and
a motor controller comprising:
a model predictive controller operating in a d-q reference frame to provide d-q reference frame voltage command signals ($v_q$, $v_d$) that counteract a magnetic cross coupling within the electric motor;
wherein the model predictive controller comprises a cost function module outputting the d-q reference frame voltage command signals ($v_q$, $v_d$) internally forced to counteract d-q axis voltage deviations in accordance with predetermined motor voltage references ($V_{dref}$, $V_{qref}$);
wherein the cost function module comprises a sum of vector norm squares cost function $$\min_{v_q, v_d} \sum_{i=k}^{k+N} W^T \|(T_{qr} - T_q(i))\|^2 + W^y \left\|\begin{pmatrix} \hat{i}_q - i_q(i) \\ \hat{i}_d - i_d(i) \end{pmatrix}\right\|^2 + \sum_{j=k}^{k+M} W^v \left\|\begin{pmatrix} v_{qref} - v_q(j) \\ v_{dref} - v_d(j) \end{pmatrix}\right\|^2$$

wherein
$i_d(i)$, $i_q(i)$ are d-q axis currents,
$\hat{i}_d$, $\hat{i}_q$ are d-q axis current references, $$\left\|\begin{pmatrix} \hat{i}_q - i_q(i) \\ \hat{i}_d - i_d(i) \end{pmatrix}\right\|$$

represents a vector norm for d-q axis motor current error for forcing the d-q motor currents ($i_d(i)$, $i_q(i)$) to the current references ($\hat{i}_d$, $\hat{i}_q$),
$v_d(j)$, $v_q(j)$ are d-q axis motor voltages,
$V_{dref}$, $V_{qref}$ are d-q axis motor voltage references, $$\left\|\begin{pmatrix} v_{qref} - v_q(j) \\ v_{dref} - v_d(j) \end{pmatrix}\right\|$$

represents a vector norm for forcing the motor voltages ($v_d(j)$, $v_q(j)$) to counteract d-q axis voltage deviations and cross coupling effects,
$T_q$ is a motor torque,
$T_{qr}$ is a motor torque reference, $$\|(T_{qr} - T_q(i))\|$$

represents a vector norm for forcing the motor torque ($T_q$) to the motor torque reference ($T_{qr}$), and
$W^T W^y$ and $W^v$ represent respective weights for the vector norm squares;
a transformation module receiving the d-q reference frame voltage command signals ($v_q$, $v_d$) and generating stationary reference frame voltage command signals ($v_{abc}$); and
a pulse-width generation module controlling the power inverter based on the stationary reference frame voltage command signals ($v_{abc}$).

2. The apparatus of claim 1 wherein the model predictive controller comprises:
the cost function module outputting cost function voltage signals ($v_q^*$, $v_d^*$); and
feedforward adjustments ($v_{qff}$, $v_{dff}$) to the cost function voltage signals ($v_q^*$, $v_d^*$) to provide the d-q reference frame voltage command signals ($v_q$, $v_d$) that counteract the magnetic cross coupling within the electric motor.

3. The apparatus of claim 2 wherein the feedforward adjustments ($v_{qff}$, $v_{dff}$) to the cost function voltage signals are provided by feedforward adjustment modules through mathematical calculations.

4. The apparatus of claim 2 wherein the feedforward adjustments ($v_{qff}$, $v_{dff}$) to the cost function voltage signals ($v_q^*$, $v_d^*$) are provided by feedforward adjustment modules through predefined data sets.

5. The apparatus of claim 4 wherein the predefined data sets are referenced by one of d-q axis motor current commands ($\hat{i}_q$, $\hat{i}_d$) and d-q axis motor currents ($i_q$, $i_d$).

6. The apparatus of claim 2 wherein the model predictive controller further comprises first order filters applied to the feedforward adjustments ($v_{qff}$, $v_{dff}$).

7. The apparatus of claim 1 wherein the model predictive controller comprises:
   the cost function module outputting cost function voltage signals ($v_q^*$, $v_d^*$); and
   feedback adjustments ($v_{qfb}$, $v_{dfb}$) to the cost function voltage signals ($v_q^*$, $v_d^*$) to provide the d-q reference frame voltage command signals ($v_q$, $v_d$) that counteract the magnetic cross coupling within the electric motor.

8. The apparatus of claim 7 wherein the feedback adjustments ($v_{qfb}$, $v_{dfb}$) to the cost function voltage signals ($v_q^*$, $v_d^*$) are provided by feedback adjustment modules through mathematical calculations.

9. The apparatus of claim 7 wherein the feedback adjustments ($v_{qfb}$, $v_{dfb}$) to the cost function voltage signals ($v_q^*$, $v_d^*$) are provided by feedback adjustment modules through predefined data sets.

10. The apparatus of claim 9 wherein the predefined data sets are referenced by d-q axis motor currents ($i_q$, $i_d$).

11. A method for controlling an electric motor including a poly-phase stator winding, comprising:
    operating a model predictive controller in accordance with a cost function in a d-q reference frame of the electric motor to provide d-q reference frame voltage command signals ($v_q$, $v_d$) that counteract a magnetic cross coupling within the electric motor;
    wherein the model predictive controller comprises a cost function module outputting the d-q reference frame voltage command signals ($v_q$, $v_d$) internally forced to counteract d-q axis voltage deviations in accordance with predetermined motor voltage references ($v_{dref}$, $v_{qref}$);
    wherein the cost function module comprises a sum of vector norm squares cost function $$\min_{v_q, v_d} \sum_{i=k}^{k+N} W^T \|(T_{qr} - T_q(i)\|^2 + W^y \left\| \begin{pmatrix} \hat{i}_q - i_q(i) \\ \hat{i}_d - i_d(i) \end{pmatrix} \right\|^2 + \sum_{j=k}^{k+M} W^v \left\| \begin{pmatrix} v_{qref} - v_q(j) \\ v_{dref} - v_d(j) \end{pmatrix} \right\|^2$$

wherein
$i_d(i)$, $i_q(i)$ are d-q axis currents,
$\hat{i}_d$, $\hat{i}_q$ are d-q axis current references, $$\left\| \begin{pmatrix} \hat{i}_q - i_q(i) \\ \hat{i}_d - i_d(i) \end{pmatrix} \right\|$$

represents a vector norm for d-q axis motor current error for forcing the d-q motor currents ($i_d(i)$, $i_q(i)$) to the current references ($\hat{i}_d$, $\hat{i}_q$),
$v_d(j)$, $v_q(j)$ are d-q axis motor voltages,
$v_{dref}$, $v_{qref}$ are d-q axis motor voltage references, $$\left\| \begin{pmatrix} v_{qref} - v_q(j) \\ v_{dref} - v_d(j) \end{pmatrix} \right\|$$

represents a vector norm for forcing the motor voltages ($v_d(j)$, $v_q(j)$) to counteract d-q axis voltage deviations and cross coupling effects, $T_q$ is a motor torque,
$T_{qr}$ is a motor torque reference, $$\|(T_{qr} - T_q(i)\|$$

represents a vector norm for forcing the motor torque ($T_q$) to the motor torque reference ($T_{qr}$), and
$W^T$ $W^y$ and $W^v$ represent respective weights for the vector norm squares;
transforming the d-q reference frame voltage command signals ($v_q$, $v_d$) into stationary reference frame voltage command signals ($v_{abc}$); and
controlling a power inverter coupled to the poly-phase stator winding of the electric motor based on the stationary reference frame voltage command signals ($v_{abc}$).

12. The method of claim 11, wherein controlling a power inverter coupled to the poly-phase stator winding of the electric motor based on the stationary reference frame voltage command signals ($v_{abc}$) comprises:
    providing a pulse-width generation module with the stationary reference frame voltage command signals ($v_{abc}$);
    generating switching vector signals ($S_{abc}$) based on the stationary reference frame voltage command signals ($v_{abc}$); and
    controlling the power inverter coupled to the poly-phase stator winding of the electric motor based on the switching vector signals ($S_{abc}$).

13. The method of claim 11, wherein operating the model predictive controller in accordance with the cost function in the d-q reference frame of the electric motor to provide the d-q reference frame voltage command signals ($v_q$, $v_d$) that counteract the magnetic cross coupling within the electric motor comprises:
    outputting cost function voltage signals ($v_q^*$, $v_d^*$); and
    adjusting the cost function voltage signals ($v_q^*$, $v_d^*$) with feedforward adjustments ($v_{qff}$, $v_{dff}$) to provide the d-q reference frame voltage command signals ($v_q$, $v_d$) that counteract the magnetic cross coupling within the electric motor.

14. The method of claim 13 wherein the feedforward adjustments ($v_{qfb}$, $v_{dfb}$) to the cost function voltage signals ($v_q^*$, $v_d^*$) are provided by mathematical calculations.

15. The method of claim 13 wherein the feedforward adjustments ($v_{qff}$, $v_{dff}$) to the cost function voltage signals ($v_q^*$, $v_d^*$) are provided by predefined data sets.

16. The method of claim 11, wherein operating the model predictive controller in accordance with the cost function in the d-q reference frame of the electric motor to provide the d-q reference frame voltage command signals ($v_q$, $v_d$) that counteract the magnetic cross coupling within the electric motor comprises:
    outputting cost function voltage signals ($v_q^*$, $v_d^*$); and
    adjusting the cost function voltage signals ($v_q^*$, $v_d^*$) with feedback adjustments ($v_{qfb}$, $v_{dfb}$) to provide the d-q reference frame voltage command signals ($v_q$, $v_d$) that counteract the magnetic cross coupling within the electric motor.

17. The method of claim 16 wherein the feedback adjustments ($v_{qfb}$, $v_{dfb}$) to the cost function voltage signals ($v_q^*$, $v_d^*$) are provided by mathematical calculations.

18. The method of claim 16 wherein the feedback adjustments ($v_{qfb}$, $v_{dfb}$) to the cost function voltage signals ($v_q^*$, $v_d^*$) are provided by predefined data sets.

19. An electrified vehicle, comprising:
an electric propulsion system including a rechargeable energy storage system and an electric drive unit, the electric drive unit including a poly-phase electric motor having a poly-phase stator winding and a traction power inverter module including a motor controller and a power inverter, the power inverter coupled to the poly-phase stator winding; and
the motor controller comprising:
a model predictive controller operating in a d-q reference frame to provide d-q reference frame voltage command signals ($v_q$, $v_d$) that counteract a magnetic cross coupling within the electric motor;
wherein the model predictive controller comprises a cost function module outputting the d-q reference frame voltage command signals ($v_q$, $v_d$) internally forced to counteract d-q axis voltage deviations in accordance with predetermined motor voltage references ($v_{dref}$, $v_{qref}$);
wherein the cost function module comprises a sum of vector norm squares cost function $$\min_{v_q, v_d} \sum_{i=k}^{k+N} W^T \|(T_{qr} - T_q(i))\|^2 + W^y \left\| \begin{pmatrix} \hat{i}_q - i_q(i) \\ \hat{i}_d - i_d(i) \end{pmatrix} \right\|^2 + \sum_{j=k}^{k+M} W^v \left\| \begin{pmatrix} v_{qref} - v_q(j) \\ v_{dref} - v_d(j) \end{pmatrix} \right\|^2$$

wherein
$i_d(i)$, $i_q(i)$ are d-q axis currents,
$\hat{i}_d$, $\hat{i}_q$ are d-q axis current references, $$\left\| \begin{pmatrix} \hat{i}_q - i_q(i) \\ \hat{i}_d - i_d(i) \end{pmatrix} \right\|$$

represents a vector norm for d-q axis motor current error for forcing the d-q motor currents ($i_d(i)$, $i_q(i)$) to the current references ($\hat{i}_d$, $\hat{i}_q$),
$v_d(j)$, $v_q(j)$ are d-q axis motor voltages,
$v_{dref}$, $v_{qref}$ are d-q axis motor voltage references, $$\left\| \begin{pmatrix} v_{qref} - v_q(j) \\ v_{dref} - v_d(j) \end{pmatrix} \right\|$$

represents a vector norm for forcing the motor voltages ($v_d(j)$, $v_q(j)$) to counteract d-q axis voltage deviations and cross coupling effects,
$T_q$ is a motor torque,
$T_{qr}$ is a motor torque reference, $$\|(T_{qr} - T_q(i))\|$$

represents a vector norm for forcing the motor torque ($T_q$) to the motor torque reference ($T_{qr}$), and
$W^T W^y$ and $W^v$ represent respective weights for the vector norm squares;
a transformation module receiving the d-q reference frame voltage command signals ($v_q$, $v_d$) and generating stationary reference frame voltage command signals ($v_{abc}$); and
a pulse-width generation module controlling the power inverter based on the stationary reference frame voltage command signals ($v_{abc}$).

20. The electrified vehicle of claim 19 wherein the model predictive controller comprises:
a cost function module outputting cost function voltage signals ($v_q^*$, $v_d^*$); and
one of (a) feedforward adjustments ($v_{qff}$, $v_{dff}$) to the cost function voltage signals ($v_q^*$, $v_d^*$) to provide the d-q reference frame voltage command signals ($v_q$, $v_d$) that counteract the magnetic cross coupling within the electric motor and (b) feedback adjustments ($v_{qfb}$, $v_{dfb}$) to the cost function voltage signals ($v_q^*$, $v_d^*$) to provide the d-q reference frame voltage command signals ($v_q$, $v_d$) that counteract the magnetic cross coupling within the electric motor.

* * * * *